(12) United States Patent
Kante et al.

(10) Patent No.: US 11,296,484 B2
(45) Date of Patent: Apr. 5, 2022

(54) PHOTONIC GENERATION AND STEERING OF COHERENT VORTEX BEAMS

(71) Applicant: THE REGENTS OF THE UNIVERSITY OF CALIFORNIA, Oakland, CA (US)

(72) Inventors: Boubacar Kante, La Jolla, CA (US); Babak Bahari, La Jolla, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 88 days.

(21) Appl. No.: 16/614,402

(22) PCT Filed: May 16, 2018

(86) PCT No.: PCT/US2018/032913
§ 371 (c)(1),
(2) Date: Nov. 18, 2019

(87) PCT Pub. No.: WO2018/213410
PCT Pub. Date: Nov. 22, 2018

(65) Prior Publication Data
US 2020/0203926 A1    Jun. 25, 2020

Related U.S. Application Data

(60) Provisional application No. 62/506,765, filed on May 16, 2017.

(51) Int. Cl.
*H01S 5/18* (2021.01)
*H01S 5/343* (2006.01)
*H01S 5/11* (2021.01)

(52) U.S. Cl.
CPC ............ *H01S 5/18* (2013.01); *H01S 5/11* (2021.01); *H01S 5/343* (2013.01); *H01S 2301/203* (2013.01)

(58) Field of Classification Search
CPC ... H01S 5/18; H01S 5/11; H01S 5/343; H01S 2301/203
See application file for complete search history.

(56) References Cited

U.S. PATENT DOCUMENTS

| | | | | |
|---|---|---|---|---|
| 6,468,823 B1 * | 10/2002 | Scherer | ............... | B82Y 20/00 385/129 |
| 2004/0089866 A1 * | 5/2004 | Nagashima | ............ | H01S 5/227 257/79 |

(Continued)

FOREIGN PATENT DOCUMENTS

| | | |
|---|---|---|
| EP | 3035456 A1 | 6/2016 |
| WO | 2017/066095 A1 | 4/2017 |

OTHER PUBLICATIONS

Lepetit et al. ("Resonantly Trapped Bound State in the Continuum Laser," Aug. 21, 2015 <URL:https://arxiv.org/ftp/arxiv/papers/1508/1508.05164.pdf>) (Year: 2015).*

*Primary Examiner* — Yuanda Zhang
(74) *Attorney, Agent, or Firm* — Mayer & Williams, PC; Stuart H. Mayer

(57) ABSTRACT

A bound states in the continuum (BIC) surface emitting laser includes a light emitter configured to generate BIC light waves. The laser also includes an array of holes with equal radii extending through the light emitter such that light emitted by the light emitter upon receipt of power is emitted as a coherent vortex beam at an angle to a surface normal of the light emitter that is determined at least in part by the radius of the holes in the array.

21 Claims, 18 Drawing Sheets

(56) References Cited

U.S. PATENT DOCUMENTS

| | | |
|---|---|---|
| 2010/0171130 A1 | 7/2010 | Ashley |
| 2010/0321478 A1 | 12/2010 | Sliwa |
| 2012/0072931 A1 | 3/2012 | Imada |
| 2017/0077667 A1 | 3/2017 | Williams et al. |

* cited by examiner

PHOTONIC GENERATION AND STEERING OF COHERENT VORTEX BEAMS

BACKGROUND

Vortices are recognized to be ubiquitous features around wave singularities, forming threads of silence in acoustic, turbulences in superfluids, and tidal waves in oceans. Light carrying Orbital Angular Momentum (OAM) has been intensively investigated due to interest in numerous fields including metrology, microscopy, quantum entanglement, and particle trapping. The theoretically unlimited orthogonal basis of OAM spatial modes makes it a candidate to overcome the data transmission capacity crunch. In 1992, Allen et al. demonstrated that beams with non-zero OAM have a "doughnut"-shaped intensity profile and carry a discrete OAM of lh per photon that results from the $e^{il\Phi}$ dependence where $\Phi$ is the azimuthal angle, h the reduced Planck constant, and the integer l is called the topological charge. On one hand, OAM in light is generally generated using non-integrated and unwieldy optical components that shape the phase front of a Gaussian laser beam. Generation methods include spiral phase plates, chiral dielectric meta-holograms, spatial light modulators, or metasurfaces.

Recently a micro-ring laser operating at a parity-time-symmetry based Exceptional Point (EP) was demonstrated. However, the strict requirement of EP operation severely limits the pump power to the single value ensuring the loss/gain balance, which in turn limits the output power of the laser. Many applications, including particle trapping and light detection and ranging (LIDAR), have minimum power requirements and would benefit from a scalable and integrable vortex beam source. On the other hand, beam steering, i.e., the ability to steer energy in controllable directions, has long been pursued and is usually implemented by optical phased arrays using technologies such as liquid crystals, acousto-optics, and electro-optics. Although Micro-Electro-Mechanical Systems (MEMS) have been recognized as a practical solution, state-of-the-art optical beam steering uses mechanisms that control the phase/intensity profile of individual nanoantennas for beam forming. These mechanisms also suffer from limitations such as complexity, poor agility, and large size of non-integrated components. Furthermore, steering is usually limited to regular Gaussian beams.

SUMMARY

Disclosed are methods, devices and systems that pertain to optical light sources that can simultaneously generate and steer a vortex beam without using any external or internal components. In one aspect of the invention, an integrated device uses wave singularities known as bound states in continuum (BIC) to simultaneously generate and steer powerful coherent beams carrying orbital angular momentum (OAM). The invention may bring substantial opportunities in the manipulation of micro-particles and micro-organisms and may be useful for applications in other areas such as biological sensing, microscopy, astronomy, high-capacity communications, quantum computing, quantum data communication, LIDAR, metrology and imaging.

BICs are singular points in the radiation region of the dispersion band diagram whose quality factor tends to infinity, which results in low threshold light sources. These singular points carry topological charges that mathematically refer to modes with singular far-field phase whose order can be identified by the far-field polarization twisting around the singular point in reciprocal or real spaces. These singular states are robust, and their position in the reciprocal space—or angle of emission in the real space—can be controlled by changing any structure parameter uniformly such as the radius of holes in photonic crystal membrane. Numerical simulations validate the steering beam with non-zero topological charge, and, to transfer this concept to semiconductor cavities, samples from an InGaAsP platform (see below paragraph) were fabricated and experiments performed to demonstrate lasing action and steering in different directions controlled by the crystal symmetry. The OAM laser beam profile was demonstrated by measuring the far-field pattern and good agreement with simulation results was observed.

An illustrative embodiment comprises a photonic crystal made of InGaAsP multiple quantum wells with periodic holes. InGaAsP is bonded onto a glass substrate using a PolyMethyl MethAcrylate (PMMA), which infiltrates holes. In this structure, there are three modes with large quality factors whose position in the reciprocal space (or angle in real space) can be controlled by changing the radius of holes or using electro-optic, acousto-optic, or phase-changed materials. Fabricating the structures with different radii and pumping them to achieve population inversion leads to lasing. Lasing is evidenced by the characteristic threshold behavior of the output power vs. input power plot. Also steering the emitted beam to large angles by decreasing their radius of holes is evident from reciprocal space imaging.

A wide variety of benefits may arise from the methods, devices and systems described herein. These advantages may include one or more of the following:

1) The light source simultaneously generates and steers a coherent vortex beam without any additional component. Usually other light sources generate and steer a simple Gaussian beam using phase arrays, or only generate vortex beam and steer using bulky external components.

2) By controlling the crystal symmetry, the structure can be engineered to generate any arbitrary vortex beams with different singularity orders (topological charges).

3) Depending on crystal symmetry, i.e., 1D or 2D crystal, or by controlling the boundary of the crystal, the structure is capable of generating and steering multiple beams simultaneously.

4) Since in the laser vortex beams are naturally generated and can be controlled to be steered in any arbitrary direction, it can significantly benefit fields such as optical trapping, biological imaging, and quantum communication.

In one aspect, a bound states in the continuum (BIC) surface emitting laser is provided. The laser includes a light emitter configured to generate BIC light waves. The laser also includes an array of holes with equal radii extending through the light emitter such that light emitted by the light emitter upon receipt of power is emitted as a coherent vortex beam at an angle to a surface normal of the light emitter that is determined at least in part by the radius of the holes in the array.

In another aspect, a method of forming a light source for generating a coherent light vortex beam is provided. In accordance with the method, a light emitter configured to generate BIC light waves when supplied with pump energy is provided. An angle is selected at which a coherent light vortex beam is to be emitted from a surface of the photonic crystal. A topology is selected for an array of holes to be formed in the photonic crystal based at least in part on the selected angle. The array of holes is formed so that they extend through the photonic crystal with the selected topology.

DETAILED DESCRIPTION

Orbital angular momentum is a fundamental degree of freedom of light that manifests itself even at the single photon level. The coherent generation and steering of structured light usually requires bulky and slow components. Using wave singularities known as bound states in continuum, an integrated device is provided that simultaneously generates and steers powerful coherent beams carrying orbital angular momentum. The device brings opportunities in the manipulation of micro-particles and micro-organisms, and, may also find applications in areas such as biological sensing, microscopy, astronomy, and, high-capacity communications.

Figure 1A:
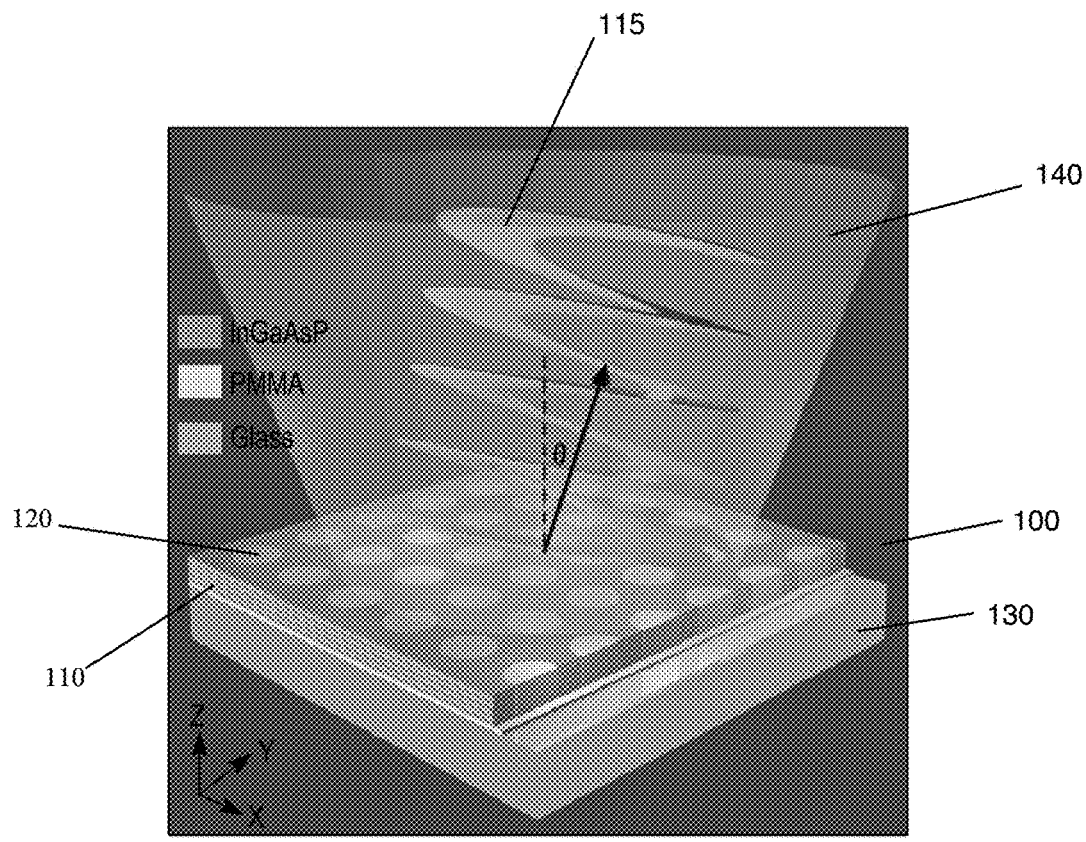
FIG. 1A is a schematic diagram of one example of an optical light source that may be used to generate a steerable coherent vortex beam.

FIG. 1A is a schematic diagram of one example of an optical light source 100 that may be used to generate a steerable coherent vortex beam 115. In this example the optical light source 100 includes an InGaAsP multiple quantum well structure 110. The multiple quantum well structure 110 is tailored to emit light at telecommunication wavelengths (e.g., 1.55 microns, 1.31 microns). The multiple quantum well structure 110, which includes an array of holes 120 that are either devoid of material (other than air) or filled with a material that is transparent at the emitting wavelength(s) such as PolyMethyl MethAcrylate (PMMA), constitutes a Photonic Crystal (PhC). The PhC may be bonded on a suitable substrate such as a flat glass substrate 130 coated with a thin layer of PMMA.

As described in more detail below, in one embodiment the multiple quantum well structure 110 includes two or more InGaAsP quantum well layers separated by one or more quantum well barrier layers (e.g., GaAsP, InGaAsP). The mole fraction of the components in each layer may be tailored so that the structure emits light at the desired wavelength(s). For instance, the quantum well layer may have the form $In_xGa_{1-x}As_yP_{1-y}$ and, in one particular realization, may include nine $In_{x=0.564}Ga_{1-x}As_{y=0.933}P_{1-y}$ quantum well layers of 10 nm thickness (bandgap wavelength of 1600 nm) and $In_{x=0.737}Ga_{1-x}As_{y=0.569}P_{1-y}$ barrier layers of 20 nm thickness (bandgap wavelength of 1300 nm). The multiple quantum well structure 110 may be initially epitaxially grown on an InP substrate. The holes 120 may be formed by electron beam lithography followed by dry etching. The resulting PhC is subsequently bonded to the flat glass substrate 130. During the bonding process the PMMA infiltrates the holes 120. Finally, the InP substrate is removed by wet etching using hydrochloric acid.

Figure 1B:
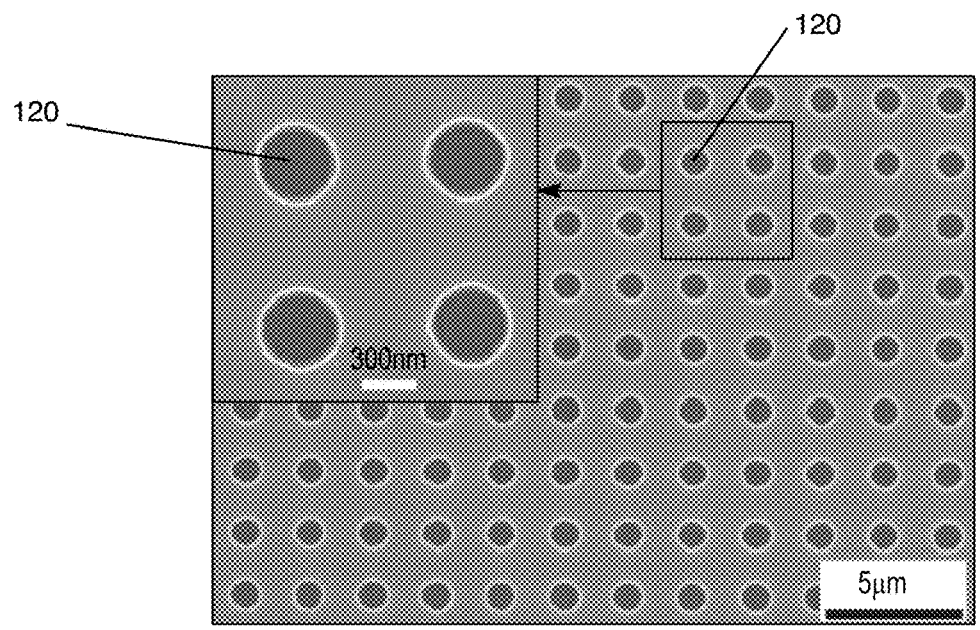
FIG. 1B illustrates the uniformity of the holes in the structure.

In operation and as further shown in FIG. 1(A), the light source 100 is optically pumped by an optical beam 140 and generates a vortex beam 115 at a controllable angle. FIG. 1(B) is a top view scanning electron micrograph of one example of the light source 100 showing the holes 120 that was fabricated to have a quantum well thickness of 300 nm, a period of 950 nm, and holes with a radius of 200 nm. FIG. 1B illustrates the uniformity of the holes 120 in the structure.

Figure 1C:
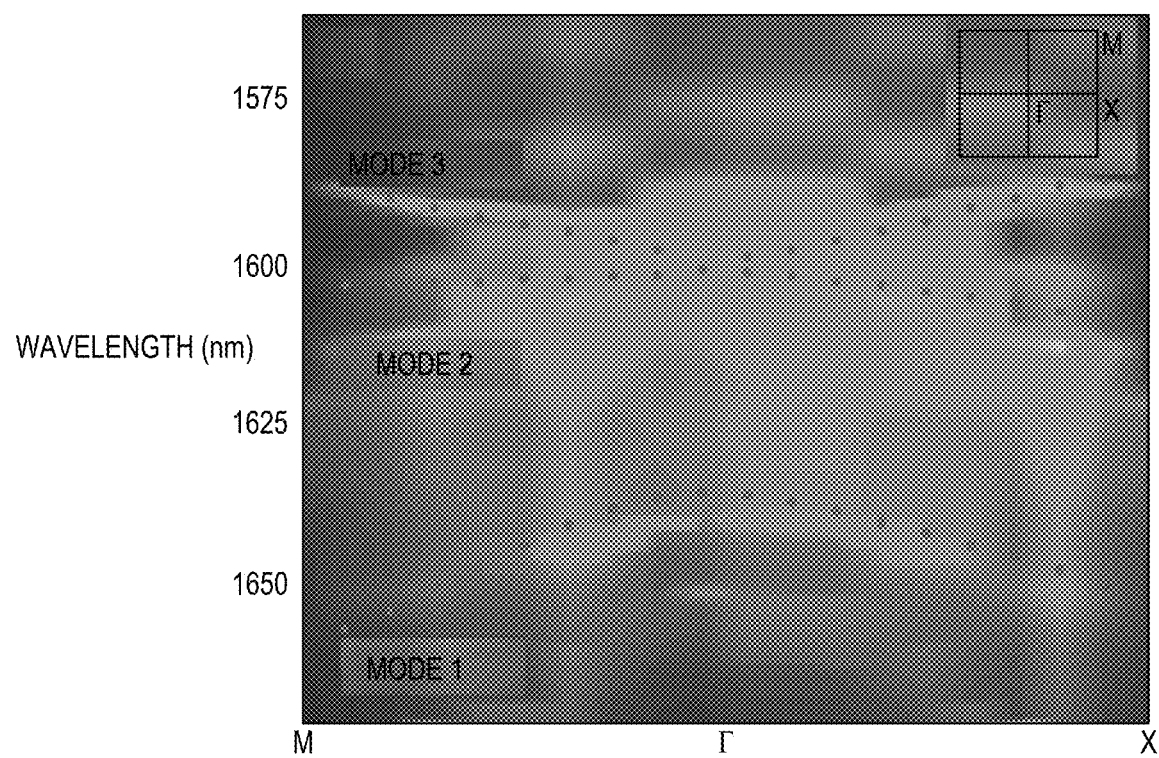
FIG. 1C shows experimental (plot) and theoretical (dots) band diagrams measured/calculated along the ΓX and the ΓM directions.

FIG. 1c shows experimental (plot) and theoretical (dots) band diagrams measured/calculated along the ΓX and the ΓM directions. As will be described in more detail below, the experimental band diagram is measured by pumping the structure with a high-energy laser and collecting the photoluminescence at different angles. A good agreement is observed between the theoretical band diagram (using finite element method) and experiments.

To understand the physics of the device, modes of the PhC are calculated using finite element method and experimentally measured by pumping the device with a high-energy laser and collecting the photoluminescence at different angles around the wavelength of 1.6 m (see Supplementary Information). FIG. 1c presents the three modes within the gain bandwidth of InGaAsP, and, a very good agreement is observed between the theoretical and the experimental band diagrams.

Mode 1 is a singly degenerate mode while modes 2 and 3 are doubly degenerate modes. By changing the radius of holes uniformly over the whole structure, all three modes shift spectrally. The quality factor of mode 1 is theoretically infinite at the center of the Brillouin zone (Γ point) and independent of the radius of holes as mode 1 is symmetry protected (Γ-locked). This type of mode (usually referred to as band-edge mode) has been extensively investigated in uniform PhC lasers that necessarily emit normal to the surface. Modes 2 and 3 can only have infinite quality factors if all radiation channels destructively interfere to form singular states, at reciprocal space points, known as bound states in continuum. These singular states are robust vortex centers carrying non-zero topological charges, and a continuous change of parameters of the systems continuously tunes the destructive interference condition away from the Γ point, resulting in beam steering of mode 2 along ΓM and mode 3 along ΓX (see FIG. 2A). Perturbing such modes, for example by varying the radius of holes of an array, is thus a method to steer laser beams without using additional components, such as phase arrays or breaking the symmetry of the system to generate an artificial band-edge mode. Since all holes have the same size in the array the required phase shift to steer the beam is naturally provided by the phase-offset between Floquet-Bloch harmonics of the periodic structure. It is worth noting that the broken $\sigma_z$ symmetry and the finite size of the realized samples limit the quality factor of modes 2 and 3 to very large but not infinite values, forming quasi-bound states in continuum.

Several devices with a range of radius of holes were fabricated to observe beam steering. The measurements were performed using a micro-photoluminescence setup (described below) in which the reciprocal space is obtained by Fourier transforming the image plane. The devices were optically pumped with a pulsed laser ($\lambda$=1064 nm, T=12 ns pulse at a repetition rate f=275 kHz). The evolution of the output power as a function of the pump power (light-light curve) for a representative sample confirms the threshold behavior and a clear transition from spontaneous emission to lasing (FIG. 2B).

Figure 2A:
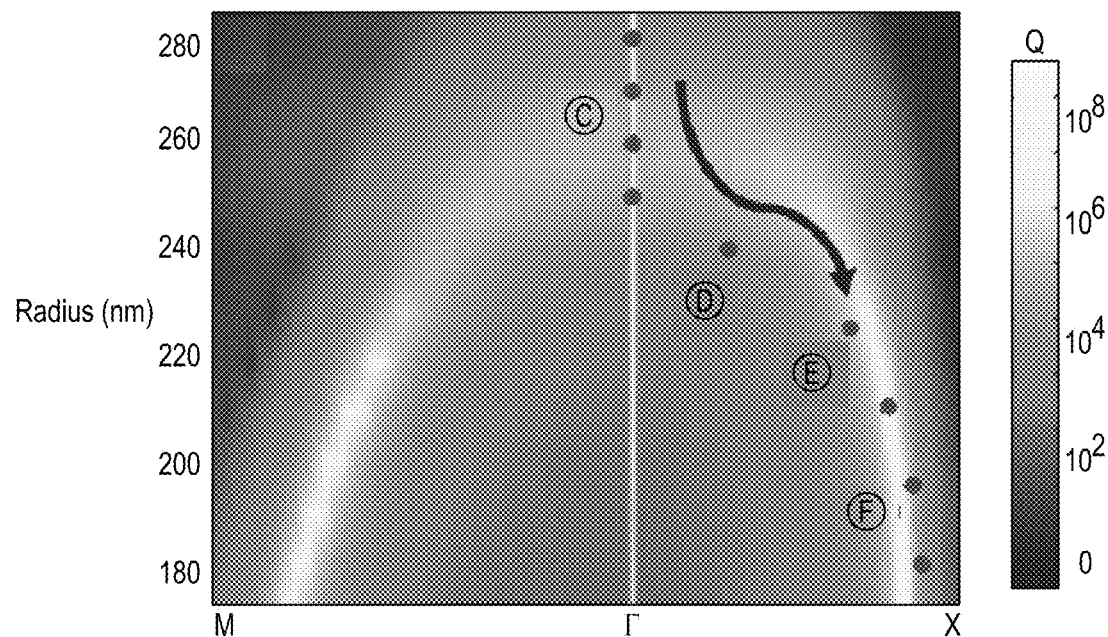
FIGS. 2A-2F demonstrate beam steering in the high-symmetry directions of the crystal in the light source.

FIGS. 2A-2F demonstrate beam steering in the crystal's high-symmetry directions. FIG. 2A shows the quality factor (Q) of modes 1-3 as a function of the radius of the holes in reciprocal space (k-space). The quality factors of modes 1, 2 and 3 are singular in k-space, at a point for mode 1 (Γ-locked), and along lines for mode 2 (steering along ΓM) and mode 3 (steering along ΓX). Modes 2 and 3 can thus continuously steer with the radius of holes. The quality factor of mode 1 is singular for all radii of holes because mode 1 is symmetry-protected while mode 2 and 3 become singular for holes radii smaller than R~250 nm. The dots correspond to experimental measurements, described below, of the steering angle that have been extracted from k-space imaging. The standard error in angle, from at least three measurements, is smaller than 0.5°.

Figure 2B:
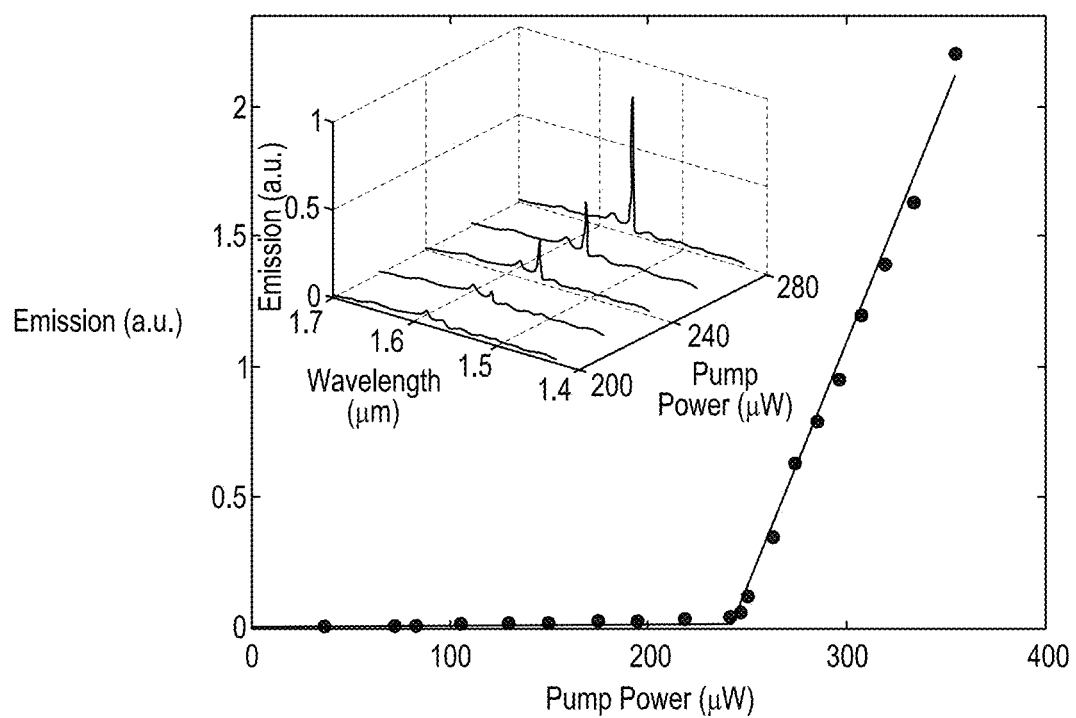
Figure 2C:
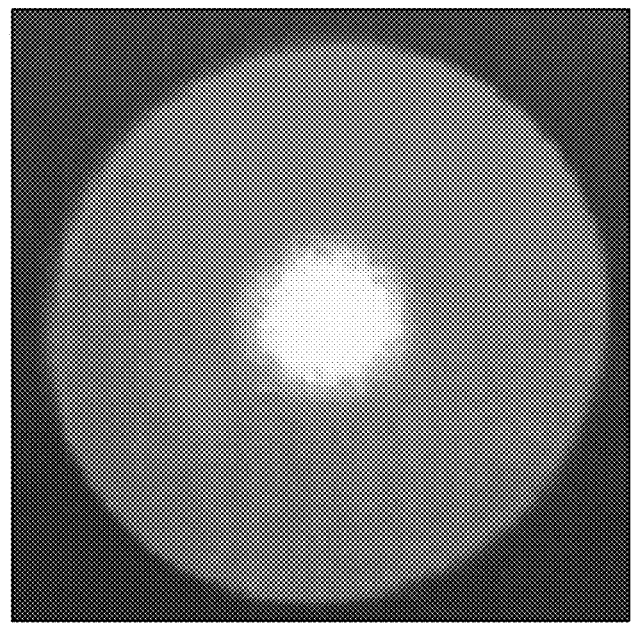

FIG. 2B shows the output power as a function of the average pump power (light-light curve) around the lasing wavelength for R=280 nm. The dots are experimental measurements of the output power for different pump powers. The solid lines are linear fits to the data in spontaneous and stimulated emission regimes and clearly show a threshold behavior, i.e. lasing. The inset shows the emission power evolution as a function of the pump power in a broader wavelength range. A similar light-light curve is measured for all other lasers (not shown). FIGS. 2C-2F show experimental k-space images of the emission from four lasers with decreasing radii. The center of the image represents the center of the Brillouin zone i.e., $k_x=k_y=0$ (Γ point). The distance of the bright spots to the center represents the in-plane wave-vector or equivalently the angle, and it increases as the radius of holes is decreased from R=250 nm (FIG. 2c), to R=240 nm (FIG. 2d), R=225 nm (FIG. 2e), and R=190 nm (FIG. 2f), clearly demonstrating steering of the lasing beam. For R=250 nm, the PhC supports only the Γ-locked mode. FIG. 2C confirms normal emission from this sample.

Figure 2D:
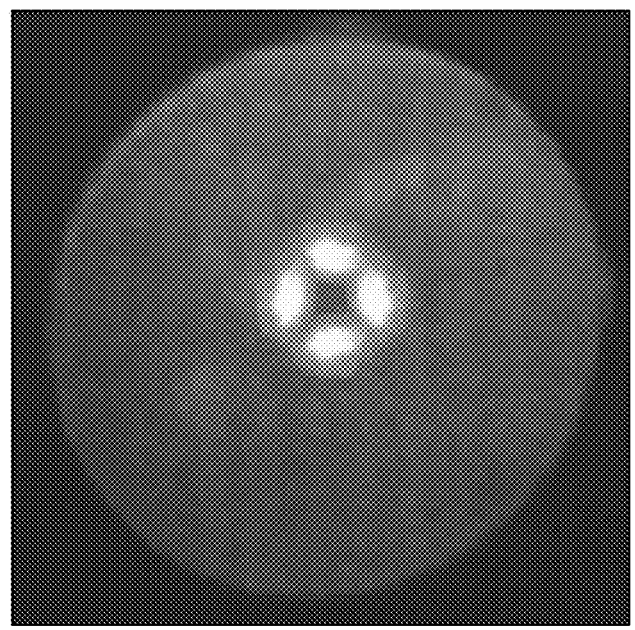
Figure 2E:
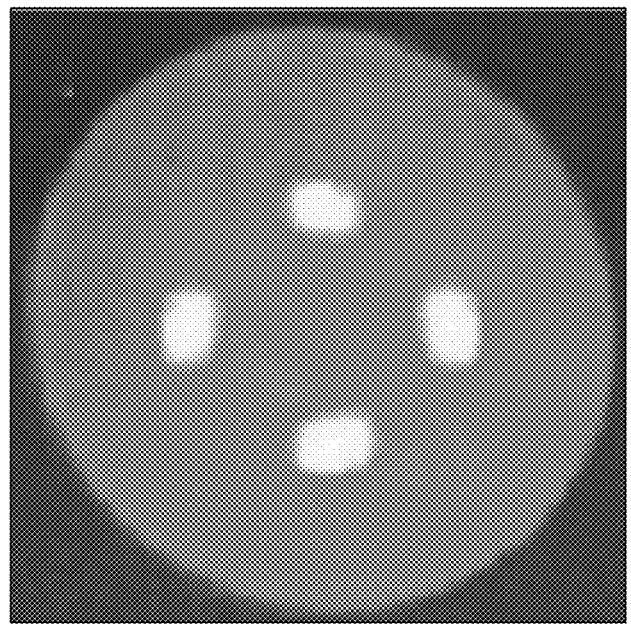
Figure 2F:
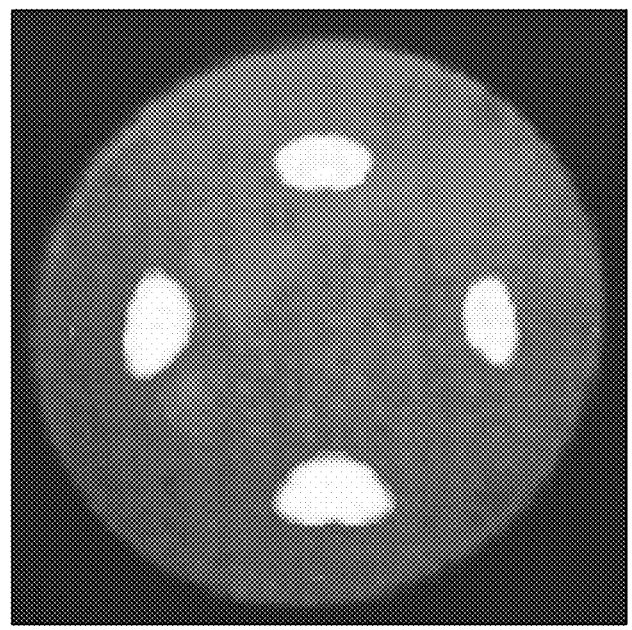

As the radius is decreased below R=250 nm, the steering of four lasing beams along ΓX is observed. They correspond to mode 3, which has a large quality factor along ΓX, and the four beams stem from the four-fold symmetry of the crystal (invariance under 90° rotation). The number of beams can be controlled by the symmetry of the crystal as well as by boundary conditions. The steering angle further increases by decreasing the radius as seen in FIG. 2D-F. The emission angles are extracted from the reciprocal space images and the numerical aperture of the collecting objective. The dots in FIG. 2A represent the experimental emission angles, and, as can be seen, lasing occurs in directions of predicted high quality factors. The operating mode is selected by its spatial overlap with the optical gain and switches from mode 1 to mode 3 for R~250 nm. The maximum observable angle in k-space imaging is given by the numerical aperture (NA) of the objective lens (NA=0.4). The four-fold symmetry of the structure implies that any singularity is invariant under 90° rotation and this is confirmed by the four observed bright spots creating a 2-by-2 array of optical vortices (see FIG. 3).

Singular states resulting from full destructive interference carry a quantized topological charge (order of singularity) that can be controlled by the topology of the structure and mathematically refer to modes with singular far-field phase whose order can be identified by the far-field polarization twisting around the singular point in reciprocal space or real space. FIGS. 3a-3f represent the experimental (FIGS. 3A-3C) and theoretical (FIGS. 3D-3F) far-fields of devices emitting at different angles. For R=180 nm (FIGS. 3a and 3d) and R=225 nm (FIGS. 3B and 3E), mode 3 (ΓX-steering), emits at an angle with a tilted doughnut-shaped pattern. For R=250 nm (FIGS. 3C and 3F), only mode 1 (Γ-locked), emits with a doughnut-shaped far-field.

Figures 3A, 3B, 3C, 3D, 3E, 3F, 3G, 3H, 3I:
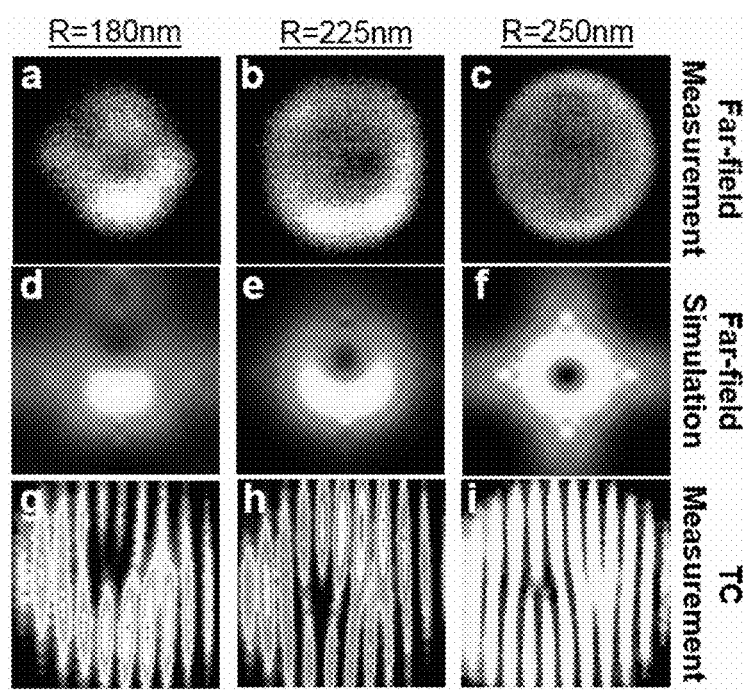
FIGS. 3A-3F represent the experimental (FIGS. 3A-3C) and theoretical (FIGS. 3D-3F) far-fields of devices emitting at different angles; patterns and thus demonstrate a topological charge of +1 and −1 for modes 3 and 1, respectively.
FIGS. 3G-3I show self-interference patterns of the emission beams for three samples with different radii.

To experimentally demonstrate the topology of these emissions, self-interference of the lasing beams is performed, which will be described below. The interference patterns comprise two inverted fork-shaped patterns and thus demonstrate a topological charge of +1 and −1 for modes 3 and 1, respectively. FIGS. 3G-3I show self-interference patterns of the emission beams for three samples with different radii. The two inverted fork-shape patterns demonstrate a topological charge (TC) of +1 for the mode steering along ΓX (mode 3) and −1 for the Γ-locked mode (mode 1).

Singularities are always created in pairs (due to charge conservation). This is evident in FIG. 2A where a high quality factor mode that steers along ΓM is predicted. However, this mode was not observed so far as it experiences less effective gain than the ΓX-steering mode. Since the existence of this mode is guaranteed by topology, it should be possible to observe lasing and steering along ΓM if the pump power is increased.

Figures 4A, 4B, 4C, 4D, 4E, 4F:
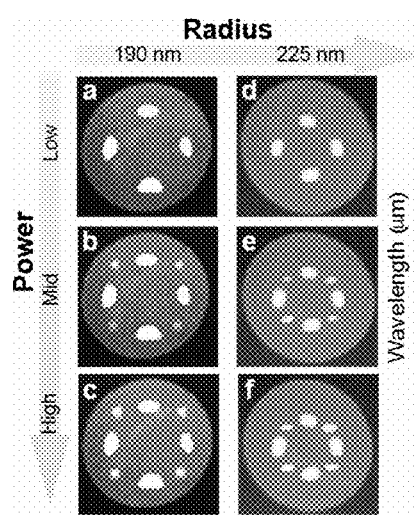
FIGS. 4A-4F show the evolution of the reciprocal space image as a function of the pump power for samples of the light source supporting all three singular modes.

FIGS. 4A-4F present the evolution of the reciprocal space image as a function of the pump power for samples supporting all three singular modes. For R=190 nm, FIG. 4A clearly shows lasing along ΓX. As the pump power is increased (FIGS. 4b-4c), it reaches the threshold of the mode steering along ΓM (mode 2) that also starts to lase (b, e) as evident from the four additional bright spots (four-fold symmetry) in k-space appearing at 450 to the previous lasing spots. Increasing the pump power further, increases the emission power of the lasing modes, making them brighter (FIGS. 4C and 4F). Similarly, for R=225 nm, additional spots appear (at a smaller angle) as the pump power is increased (FIGS. 4D-4F). These results demonstrate steering along ΓM. The modes can be further identified by their wavelength scaling.

The threshold of the mode steering along ΓM (mode 2, threshold$_{\Gamma M}$) is larger than the threshold of the mode steering along ΓX (mode 3, threshold$_{\Gamma X}$). For pump powers smaller than threshold$_{\Gamma M}$ (threshold$_{\Gamma X}$<threshold$_{\Gamma M}$), the mode steering along ΓX is the only mode lasing in the device. The relative threshold of the modes is governed by their effective gain that depends not only on the modes distribution in the device but also the gain spectrum of the multiple quantum wells. For R=190 nm the emission angle of mode 2 is 13.5° and the emission angle of mode 3 is 11.1°. For R=225 nm, the emission angle of modes 2 and 3 is 8°, demonstrating steering, both along ΓX and ΓM.

Figure 4G:
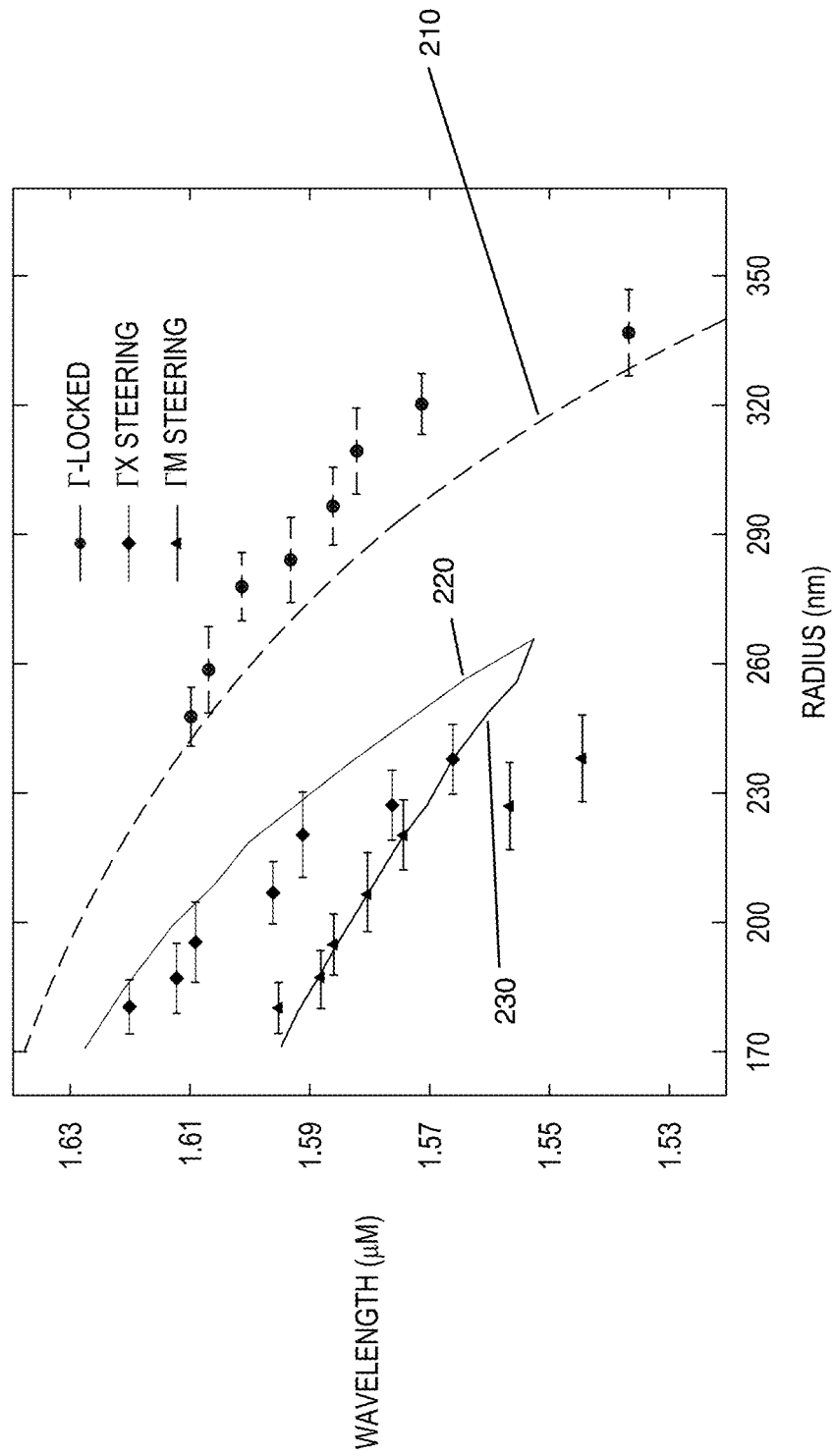
FIG. 4G shows the lasing wavelength as a function of the radius of holes from 180 nm to 350 nm.

FIG. 4G shows the lasing wavelength as a function of the radius of holes from 180 nm to 350 nm. The continuous lines represent the theoretical prediction of the wavelength of each mode with large quality factor as a function of the radius of holes. Dots represent measured wavelengths of emissions from the lasers. Each point corresponds to a device with a specific radius. Error bars indicate the standard deviation of radii measured from fabricated devices. Solid lines represent the wavelength of the singularities (resonances with large quality factor) of mode 1 (line 210), mode 2 (line 220), and mode 3 (line 230) for different radii of the holes. The good agreement between theory and experiment constitutes an additional identification of the modes.

Fabrication of Coherent Vortex Beam Sources

Figure 5:
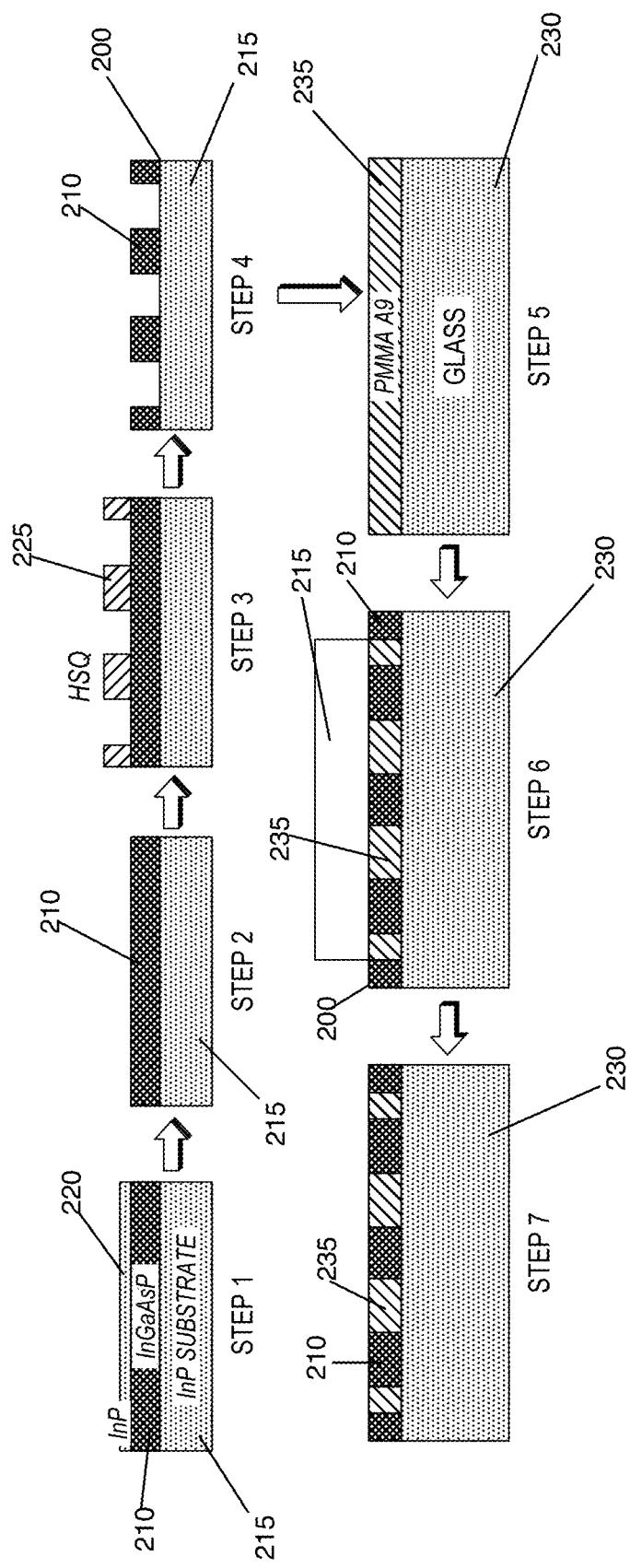
FIG. 5 is a schematic diagram illustrating one particular example of a sequence of steps for fabricating the coherent vortex beam source described herein.

FIG. 5 is a schematic diagram illustrating one particular example of a sequence of steps for fabricating the coherent vortex beam source described herein. The formation of the multiple quantum well wafer 200 is shown in steps 1-4. The active layer of the wafer 200 includes an InGaAsP multiple quantum well structure 210, the layers of which are epitaxially grown on a lattice-matched InP substrate 215 (step 1). In some embodiments the InGaAsP multiple quantum well structure 210 may be a prefabricated, commercially available structure. In one example, the thickness of the InGaAsP is finely controlled to be 300 nm. A 10 nm InP protective layer 220 is formed on top of InGaAsP. The top InP protective layer 220 is removed by dipping the sample in a chemical solution of HCl:H$_2$O (3:1) for 60 sec (step 2). A Hydrogen SilsesQuioxane (HSQ) negative tone resist 225 is then coated onto the InGaAsP multiple quantum well structure 210 before electron beam lithography (step 3). The written pattern is transferred onto InGaAsP using a dry etch process (e.g., reactive ion etching) using H$_2$:CH$_4$:Ar (40:10:7) for seven minutes. The HSQ resist 225 is then removed by dipping it into the hydrofluoric acid (step 4) to complete the patterning of the multiple quantum well wafer 200.

Next, a layer 235 of PolyMethyl MethAcrylate (PMMA) A9 is applied to a glass substrate 230 to bond the sample onto the glass substrate 230 (step 5). In particular, after cleaning the glass substrate, PMMA is coated onto glass for 60 sec with a spinning speed and acceleration of 4000 rpm and 1000 rpm/sec, respectively. The sample is then annealed at 185° C. for five minutes, completing the formation of the PMMA layer 235 on the glass substrate 230. The multiple quantum well wafer 200 is subsequently bonded on the glass substrate 230 by positioning the InGaAsP multiple quantum well structure 210 on the PMMA layer 235. Bonding is accomplished with a clamp to apply uniform pressure. The entire structure is then put into an oven for curing at 240° C. for one hour under 40 kPa pressure. The curing process lasts for about five hours in total, including about one hour to raise the temperature from room temperature to 240° C., one hour of curing at this temperature and about three hours to cool down the sample to room temperature (step 6). Due to the high pressure and temperature, the PMMA infiltrates the holes that were etched in the multiple quantum well structure 210.

Finally, the InP substrate 215 is removed using a chemical solution of HCl:H$_2$O (3:1) (step 7). This solution does not etch the glass, the PMMA or the InGaAsP. The whole etching process to remove the InP lasts about one hour. This step is also visually controllable, because InGaAsP is perfectly crystalline and is thus flat and visually reflective, whereas InP becomes rough during etching. When the hydrochloric acid reaches the InGaAsP, etching stops. The resulting structure is then removed from the solution and rinsed with deionized (DI) water.

Figures 6A, 6B, 6C, 6D, 6E:
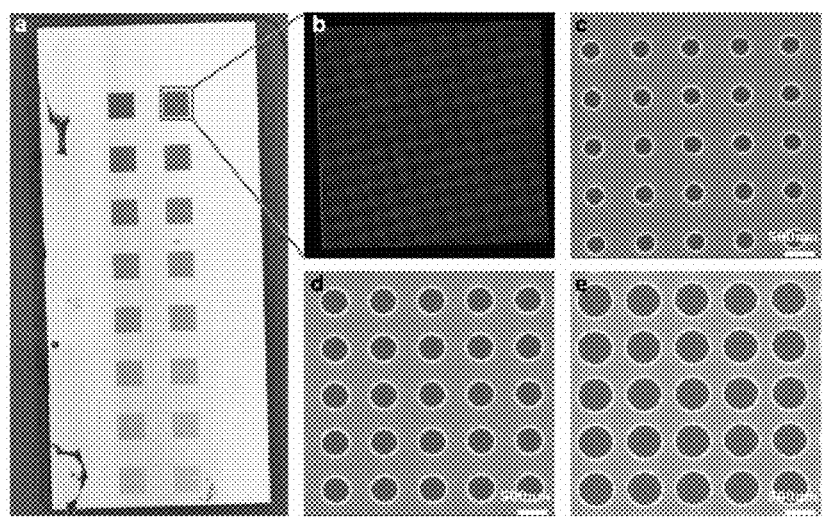
FIG. 6A shows an optical microscope image of the final light source sample fabricated in accordance with the method described in connection with FIG. 5.
FIG. 6B shows a zoom-in dark field microscope image of one of arrays with a size of 200×200 unit cells.
FIGS. 6c-6e are Scanning Electron Micrograph (SEM) images of some of the arrays with different radii: 180 nm (FIG. 6C), 250 nm (FIG. 6D), and 350 nm (FIG. 6E).

FIG. 6a shows an optical microscope image of the final sample fabricated in accordance with the method described in connection with FIG. 5. The sample contains different 200×200 arrays with the radii between 180-350 nm. A zoom-in dark field microscope image of one of arrays with a size of 200×200 unit cells, is shown in FIG. 6B. FIGS. 6C-6E are Scanning Electron Micrograph (SEM) images of some of the arrays with different radii: 180 nm (FIG. 6C), 250 nm (FIG. 6D), and 350 nm (FIG. 6E).

Figure 7:
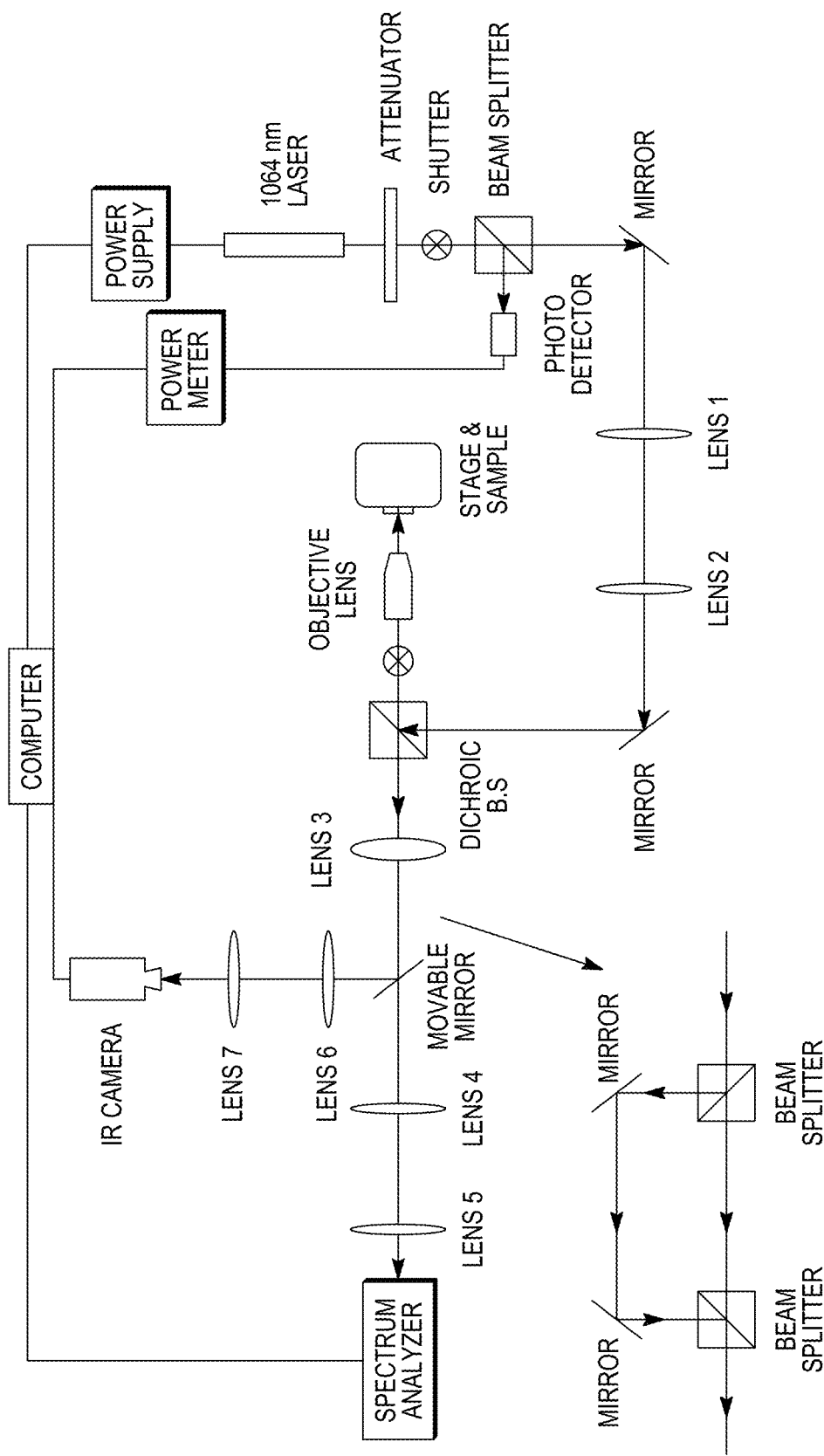
FIG. 7 shows a schematic diagram of the arrangement used to characterize the coherent vortex beam source described herein.

Characterization of Lasers, Real/Reciprocal Spaces and Topological Charge Measurements FIG. 7 shows a schematic diagram of the arrangement used to characterize the coherent vortex beam source described above. A high-energy laser source generates a pump beam at a wavelength of 1064 nm to induce population inversion in the InGaAsP structure. By using an attenuator and a power detector, the power of the pump laser illuminating the sample is finely controlled. Also, the spot width of the pump laser, which initially is 3 mm$^2$, is reduced and collimated using two lenses (lenses 1 and 2) before reaching the objective lens. An objective lens with a numerical aperture and magnification of 0.4 and X20 is used to pump the sample and collect the emission simultaneously. The emitted power from the sample, which is in the wavelength range of 1400-1700 nm, is directed to the spectrum analyzer configured as a monochromator (CVI Digikrom DK480) in conjunction with a cooled InGaAs detector in lock-in detection configuration. In the same set-up, by using a removable mirror in the path of the emission beam, the light can be directed to an infrared camera for real space or reciprocal space imaging by placing the camera in the real plane or Fourier plane, respectively. To perform interference measurements, the configuration shown in the inset of FIG. 7 is placed in the emission path. The configuration includes two beam splitters and two mirrors mounted on a translation stage, enabling a fine control of the optical path difference between the two interfering beams.

Simulation of Devices

Figure 8A:
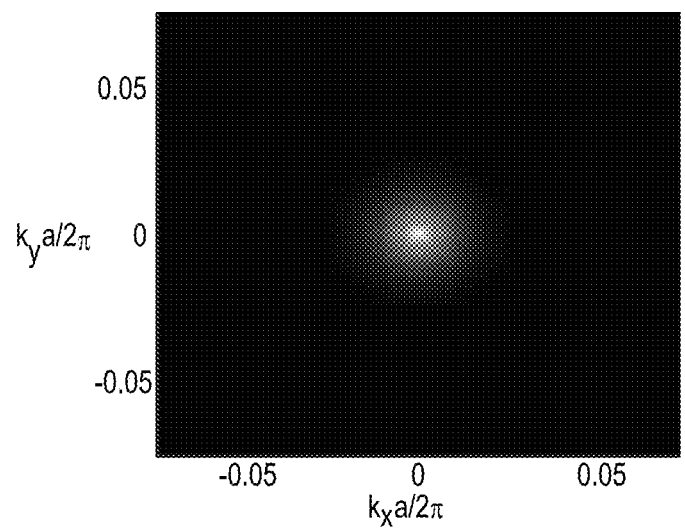
FIGS. 8A-8C show the quality factor map in the $1^{st}$ Brillouin zone for modes 1 (FIG. 8A), 2 (FIG. 8B) and 3 (FIG. 8C).
Figure 8B:
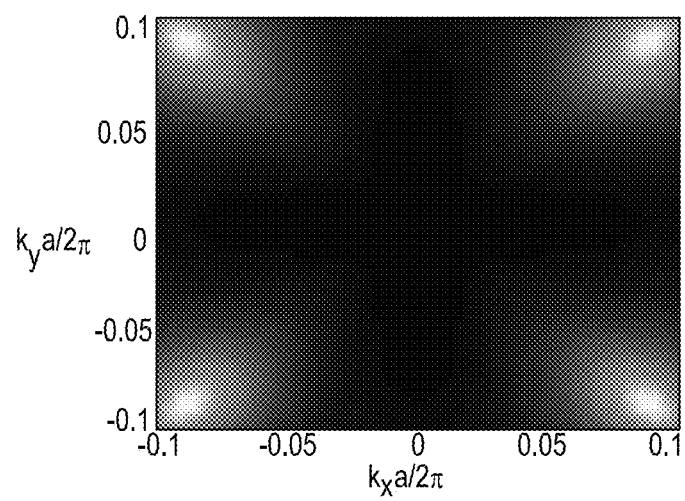
Figure 8C:
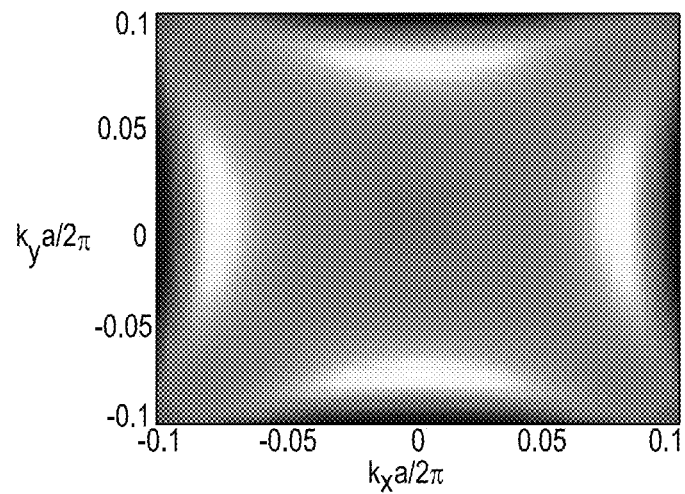

A finite-element simulation tool (COMSOL Multiphysics) was used to perform eigen-mode calculations. Simulations were performed on a unit cell with periodic boundary condition, and for every momentum ($k_x$, $k_y$) in the 1$^{st}$ Brillouin zone, the complex eigen-frequencies are computed. FIGS. 8a-8c show the quality factor map in the 1$^{st}$ Brillouin zone for modes 1 (FIG. 8A), 2 (FIG. 8B) and 3 (FIG. 8C). Mode 1 has a large quality factor at the center of the 1st Brillouin zone (Γ point), while modes 2 and 3 have large quality factors along ΓM and ΓX directions, respectively). For the simulation, a unit cell was used with periodic boundary conditions in the x-y plane, and Perfectly Matched Layers (PML) in the normal direction. The substrate is glass with a refractive index of 1.5, while the cladding is air. PMMA used for bonding the InGaAsP onto glass has a refractive index of 1.5.

Far-field amplitudes and polarizations were extracted from simulations. To calculate the topological charge associated to a singular point, the far-field information was used to calculate the polarization rotation on any arbitrary closed loop, C, which encloses the singular point in the Brillouin zone. The topological charge is calculated using Eq. 1:

$$q = \frac{1}{2\pi} \oint_C \nabla_k \phi(k) \cdot dk, \quad (1)$$

where $\phi(k)=\arg [c_x(k)+ic_y(k)]$, and $c_x/c_y$ are x/y components of the averaged field, $\langle u_k \rangle$, and $u_k$ is defined as the periodic part of the Floquet-Bloch modes, $E(r, k)=e^{ik \cdot r}u_k(r)$. Following this procedure, topological charges of −1, −1, and +1 were obtained for modes 1, 2, and 3, respectively.

Figure 9A:
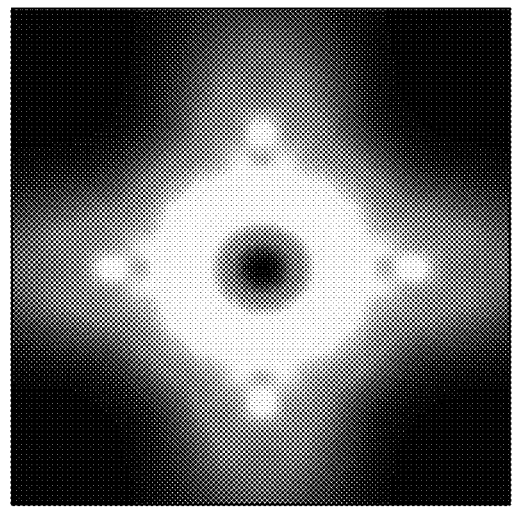
FIGS. 9A-9B shows the far-field pattern of the light source in which mode 1 is emitting normal to the surface and is doughnut-shaped (FIG. 9A), while mode 3 is emitting at an angle, and is tilted doughnut-shaped (FIG. 9B).
Figure 9B:
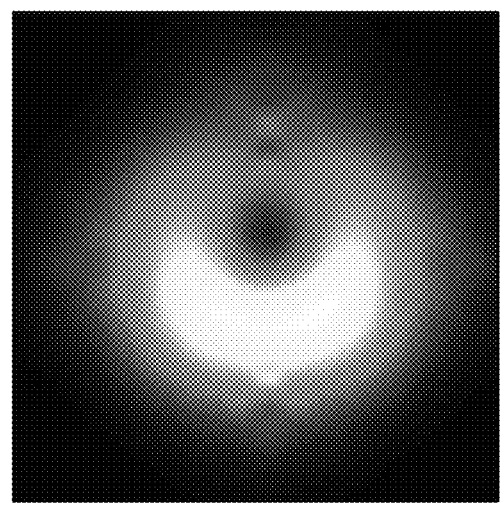

From near-fields, the far-field was calculated by using near- to far-field transformation. Since a large area (more than 50×50) was pumped uniformly, the unit cell field profile was repeated in a large area to emulate the experiment. It is important to note that the Floquet-Bloch phase, $e^{ik \cdot r}$, should be accounted for when repeating the unit cell field profile. Above R=250 nm, the laser is operating on mode 1, while below this radius it operates on mode 3. FIGS. 9A-9B shows the far-field pattern of the light source in which mode 1 is emitting normal to the surface and is doughnut-shaped (FIG. 9A), while mode 3 is emitting at an angle, and is tilted doughnut-shaped (FIG. 9B).

Controlling the Number of Beams with Boundaries

The fabricated arrays are quite large arrays with dimensions of 200×200 unit cells. The four-fold symmetry, i.e., invariance under 90° rotation implies that any singular state in reciprocal space must have the same symmetry. Consequently, four beams in the emission should be observed (FIGS. 2C-2F). However, by controlling, for example, the in-plane feedback between the Floquet-Bloch waves in certain directions we can actually control the number of beams. For instance, by choosing crystals with different symmetries/dimensionalities, e.g., 1D crystal, which is invariant under 180° rotation (two-fold symmetry), two beams instead of four beams should be observed. Another possible method, which was used here, is to control the in-plane feedback by bringing certain boundaries closer. Several arrays were fabricated with different sizes of unit cells in x and y directions, 10×200, 15×200, and 25×200. The in-plane feedback along the short direction is drastically reduced, almost suppressed, while it remains the same in the long direction.

It is worth noticing that emitted beams do not destructively interfere with each other to cancel the vortex because, the four beams lasing along the four equivalent ΓX directions carry the same topological charges but in four different directions. They are only cancelled when the radius is close to the R~250 nm, and mode 2 (lasing along ΓM), which has the opposite topological charge, becomes degenerate with mode 3.

Figure 10A:
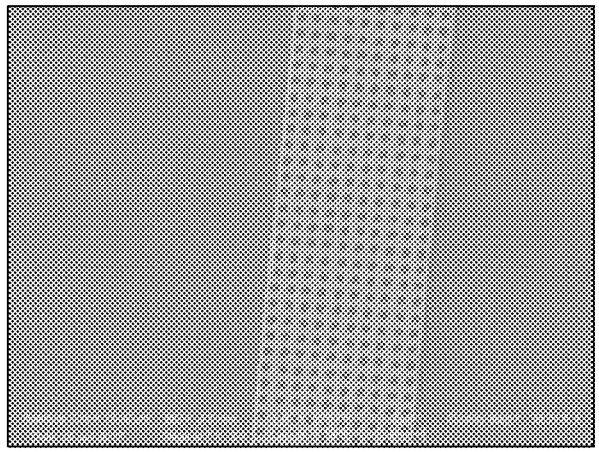
FIGS. 10A-10C show SEM images of hole arrays with dimensions of 10×200 (FIG. 10A), 15×200 (FIG. 10B) and 25×200 (FIG. 10C).
Figure 10B:
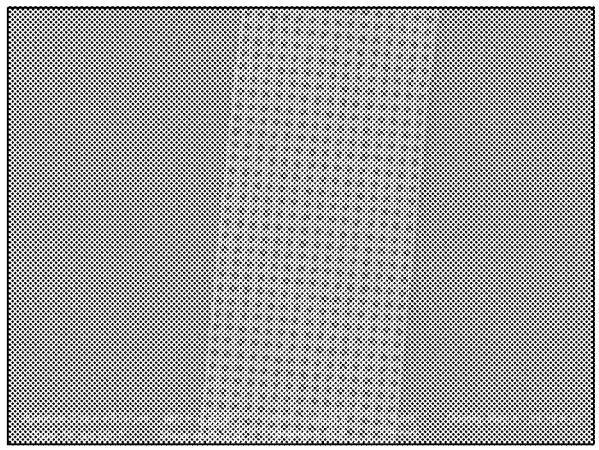
Figure 10C:
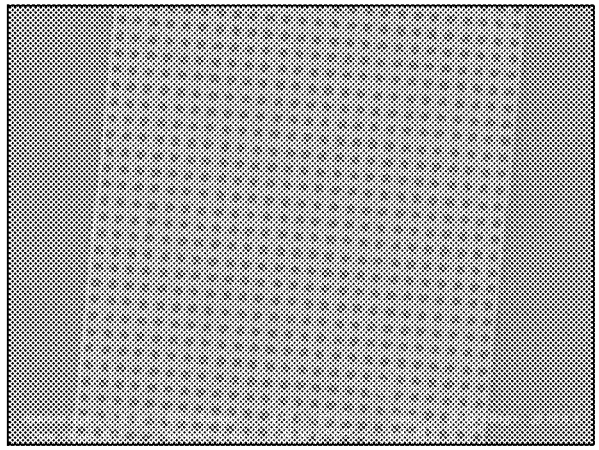
Figure 11A:
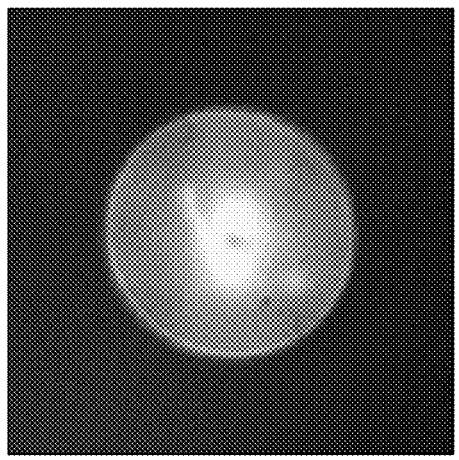
FIGS. 11A-11C show reciprocal space measurements for finite hole arrays with dimensions of 10×200 (FIG. 11A), 15×200 (FIG. 11B), and 25×200 (FIG. 11C).
Figure 11B:
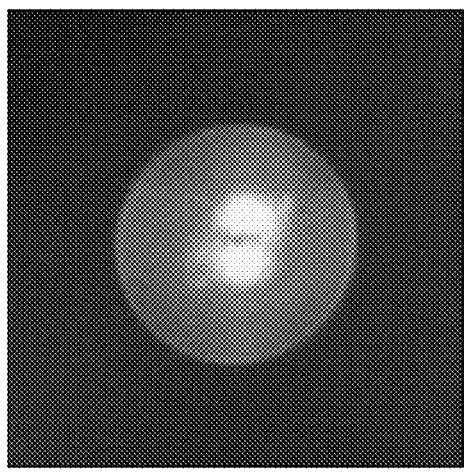
Figure 11C:
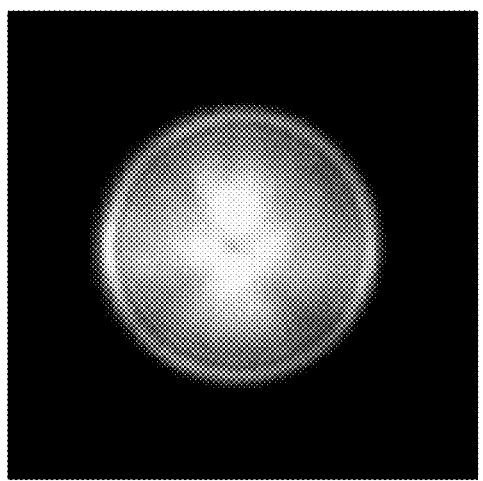

FIGS. 10A-10C show SEM images of hole arrays with dimensions of 10×200 (FIG. 10A), 15×200 (FIG. 10B) and 25×200 (FIG. 10C). FIGS. 11A-11C show reciprocal space measurements for finite hole arrays with dimensions of 10×200 (FIG. 11A), 15×200 (FIG. 11B), and 25×200 (FIG. 11C). The measurements were performed by placing the camera in the Fourier plane. The imaging angle is limited by the numerical aperture (NA) of the objective lens (NA=0.4). For the arrays of 10×200 (a) and 15×200 (b) there are two beams along ΓX directions, but for the array of 25×200 (c) there are four beams along four equivalent ΓX directions. Arrays of 25×200 are large enough to induce sufficient in-plane feedback along both directions of periodicity to enable lasing. The two beams along the vertical axis are brighter than the other two along the horizontal axis. By increasing the size of the array (>25 unit cells), all the four spots tend to become the same.

Effective Gain and Far-Field Patterns

Figure 12A:
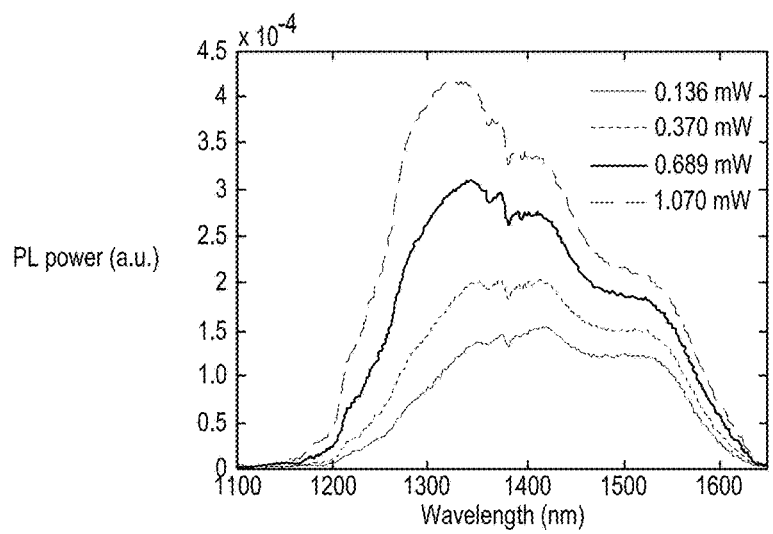
FIG. 12A shows the gain spectrum measurement of the unpatterned InGaAsP, bonded on a glass substrate using PMMA, as a function of pump power.
Figure 12B:
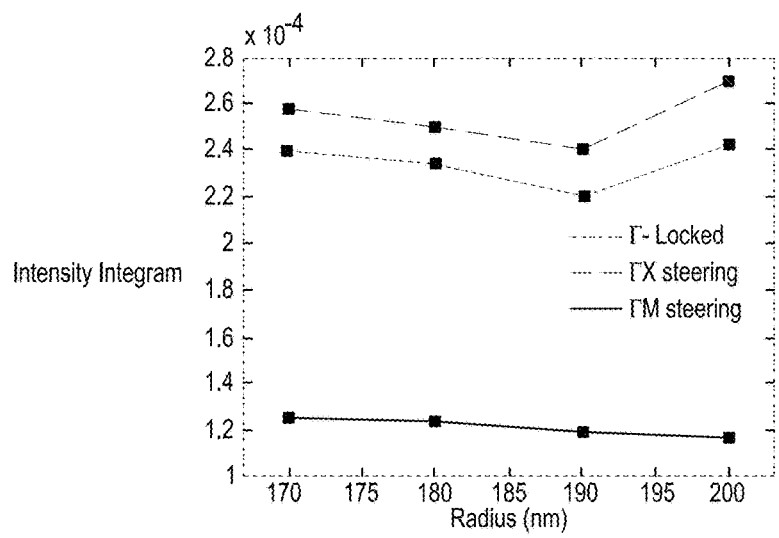
FIG. 12B shows the calculated integrated intensity of modes 1-3 inside the volume of the gain material (InGaAsP) in a unit cell.
Figure 12C:
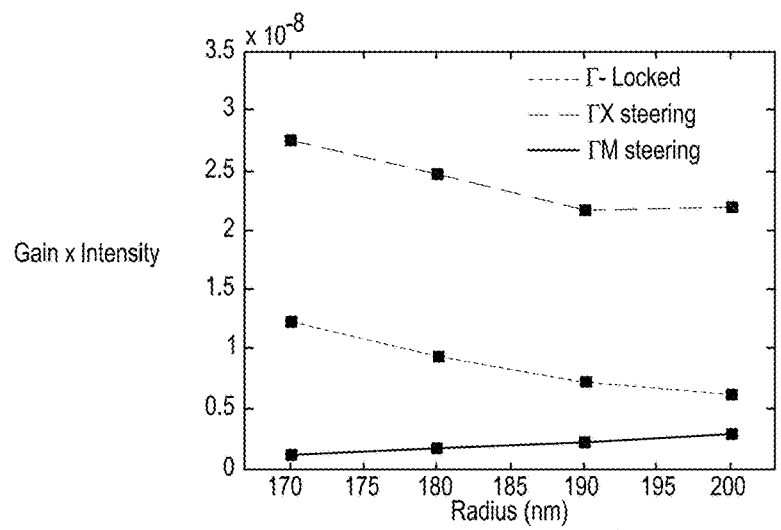
FIG. 12C shows the multiplication of the gain and the intensity of the field inside the gain material to evaluate the effective gain for modes 1-3.

FIG. 12A shows the gain spectrum measurement of the unpatterned InGaAsP, bonded on a glass substrate using PMMA, as a function of pump power. FIG. 12B shows the calculated integrated intensity of modes 1-3 inside the volume of the gain material (InGaAsP) in a unit cell. FIG. 12C shows the multiplication of the gain and the intensity of the field inside the gain material to evaluate the effective gain for modes 1-3. Mode 3 has larger effective gain than the other modes in a radius range of 170-200 nm, where all three modes have large quality factors.

For larger radii (R>250 nm), mode 1 is the only one with a large quality factor. However, for radii below R=250 nm, modes 2 and 3 also have large quality factors and gain competition then takes place. In the gain spectrum, mode 3 experiences more gain because it has a shorter wavelength compared to the other two modes, and mode 1 experiences less gain because it has a longer wavelength (FIG. 12A). Additionally, the field intensity confinement inside the gain material for mode 3 is larger than mode 1 and 2 (FIG. 12B), which ultimately results in larger effective gain for mode 3 (FIG. 12C). Therefore, mode 3 lases with a smaller threshold power compared to the other modes. By increasing the pump power, mode 2 also starts lasing as shown in FIG. 4. However, the threshold power of mode 1 is comparable to the damage threshold of the gain material for small radii.

Figure 13A:
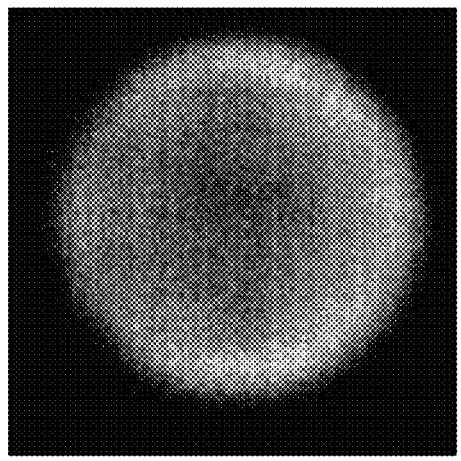
FIGS. 13A-13B shows far-field measurements for arrays with radii of 250 nm (FIG. 13A), and 225 nm (FIG. 13B)
Figure 13B:
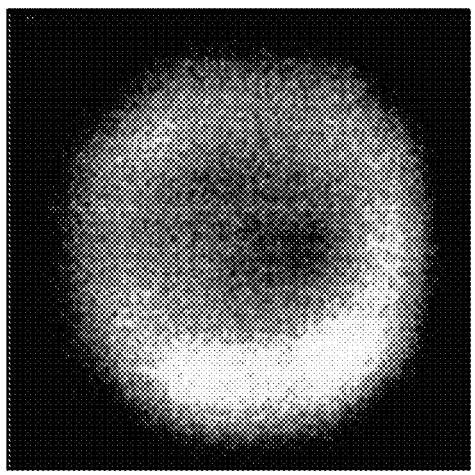
Figure 13C:
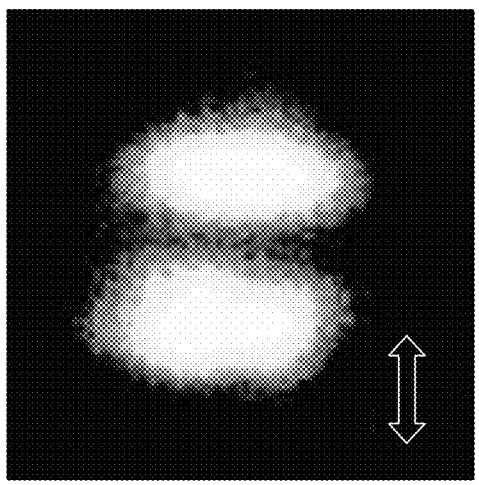
FIGS. 13C-13F show the far-field measurements when the linear polarizer in FIG. 7 is inserted in the emission path of the laser with an angle of 0°, 30°, 90° and −45°, respectively.
Figure 13D:
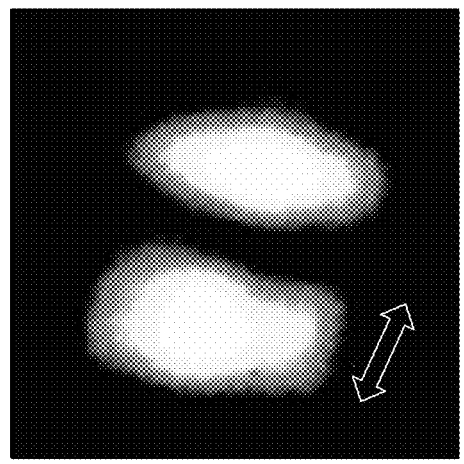
Figure 13E:
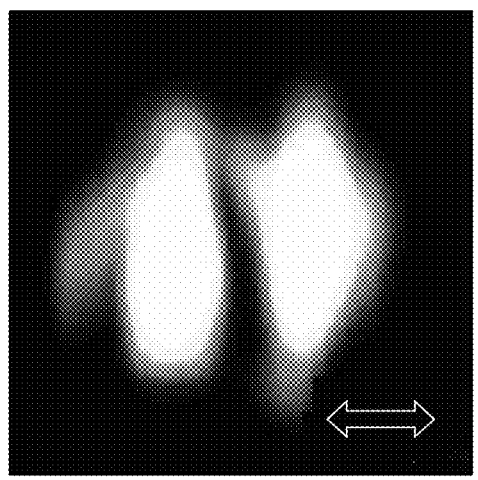
Figure 13F:
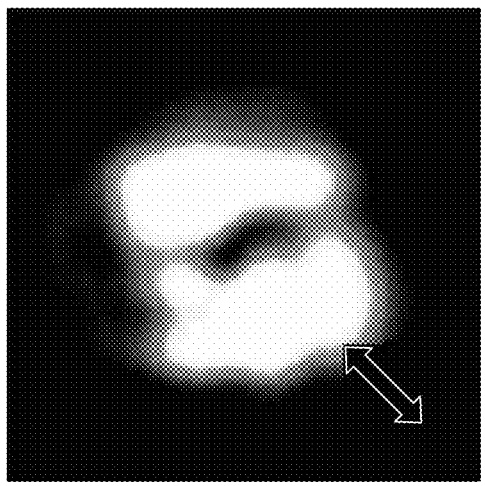

FIGS. 13A-13B shows far-field measurements for arrays with radii of 250 nm (FIG. 13A), and 225 nm (FIG. 13B). To measure the far-field pattern, the movable mirror, shown in FIG. 7, is positioned to direct the emission beam toward the camera. The measured far-field patterns agree with the simulations shown in FIG. 9. By using a linear polarizer in the path of the emission beam, a two-lobed intensity pattern is observed, which rotates by rotating the polarizer. Similar results were obtained for all arrays with different radii, further confirming the doughnut-shaped far-field patterns. In particular, for the array with a radius of 250 nm (shown), FIGS. 13C-13F show the far-field measurements when the linear polarizer is inserted in the emission path of the laser with an angle of 0°, 30°, 90° and −45°, respectively. These results lead to the observation of two-lobe shaped patterns coming from doughnut-shaped mode. The arrows in the inset show the direction of the polarizer.

In summary, a topological light source has been demonstrated that generates and steers coherent vortex beams from a fully integrated laser. The device, made of an array of holes in InGaAsP multiple quantum wells, operates at singular points where destructive interference occurs between radiative channels of the photonic structure. These points continuously move along lines in reciprocal space as a function of the radius of holes. The integrated system emits light with orbital angular momentum that can be steered in arbitrary directions controlled by the symmetry of the crystal without requiring mechanical components or breaking the in-plane symmetry of the system for beam forming. Dynamical beam steering could be implemented by bonding the structure on electro-optic, acousto-optic, or phase-changed materials. The proposed scalable and steerable vortex beam source open unprecedented opportunities in micro-particles and micro-organisms manipulation as it enables not only their remote trapping and rotation from powerful emitted beams but also their translation. The device will find applications in multiple areas such as biological sensing, microscopy, astronomy, and high-capacity communications, for example.

While the techniques described herein have been described in terms of a multiple quantum well structure that is formed from a material system comprising InGaAs grown over InP, these techniques may be equally applied to multiple quantum well structures formed from other material systems including, for instance, InAlGaAs/InGaAs and AlGaSb/GaSb. These material systems may result in light sources that operate any suitable wavelengths(s), including wavelengths in the ultraviolet and visible spectral bands. Moreover, these techniques may also be applied to semiconductor light emitters other than multiple quantum well structures. For instance, the present techniques may be applied to bulk semiconductor light emitting materials.

Although the subject matter has been described in language specific to structural features and/or methodological acts, it is to be understood that the subject matter defined in the appended claims is not necessarily limited to the specific features or acts described above.

The invention claimed is:

1. A bound states in the continuum (BIC) surface emitting laser, comprising:
    a light emitter configured to generate BIC light waves; and
    an array of holes with equal radii extending through the light emitter such that light emitted by the light emitter upon receipt of power is emitted as a coherent vortex beam at an angle to a surface normal of the light emitter that is determined at least in part by the radius of the holes in the array.

2. The BIC surface emitting laser of claim 1 wherein the light emitter includes a photonic crystal.

3. The BIC surface emitting laser of claim 1 wherein the light emitter includes a multiple quantum well structure.

4. The BIC surface emitting laser of claim 3 wherein the multiple quantum well structure includes an InGaAsP quantum well material.

5. The BIC surface emitting laser of claim 1 wherein the light emitter includes a bulk semiconductor light emitting material.

6. The BIC surface emitting laser of claim 1 wherein the light emitter is configured to generate the BIC light waves at a wavelength of 1.55 or 1.31 microns.

7. The BIC surface emitting laser of claim 1 wherein the light emitter includes an active structure mounted on a substrate.

8. The BIC surface emitting laser of claim 7 wherein the holes are filled with a material that secures the active structure to the substrate.

9. The BIC surface emitting laser of claim 8 wherein the material is transparent at a wavelength of the BIC light waves.

10. The BIC surface emitting laser of claim 1 wherein the light emitter is configured to
    generate the BIC light waves upon being pumped with optical pump energy.

11. A method of forming a light source for generating a coherent light vortex beam, comprising:
    providing a light emitter configured to generate BIC light waves when supplied with pump energy;
    selecting an angle at which the coherent light vortex beam is to be emitted from a surface of a photonic crystal;
    selecting a topology for an array of holes to be formed in the photonic crystal based at least in part on the selected angle; and
    forming the array of holes so that they extend through the photonic crystal with the selected topology.

12. The method of claim 11 wherein selecting the topology for the array of holes includes selecting the radius of the holes based at least in part on the selected angle.

13. The method of claim 12 wherein selecting the radius of the holes includes selecting a common radius for all of the holes.

14. The method of claim 11 wherein the light emitter includes the photonic crystal.

15. The method of claim 11 wherein the light emitter includes a multiple quantum well structure.

16. The method of claim 15 wherein the multiple quantum well structure includes an InGaAsP quantum well material.

17. The method of claim 11 wherein the light emitter includes a bulk semiconductor light emitting material.

18. The method of claim 11 wherein the light emitter includes an active structure mounted on a substrate.

19. The method of claim 18 wherein the holes are filled with a material that secures the active structure to the substrate, the material being transparent at a wavelength of the BIC light waves.

20. The method of claim 11 wherein the light emitter is configured to generate the BIC light waves upon being pumped with optical pump energy.

21. A BIC surface emitting laser constructed in accordance with the method of claim 11.

* * * * *